(12) United States Patent
Yang et al.

(10) Patent No.: US 8,480,448 B2
(45) Date of Patent: Jul. 9, 2013

(54) DONOR FILM FOR LASER INDUCED THERMAL IMAGING METHOD, LIGHT EMITTING DEVICE USING THE SAME, AND METHOD OF MANUFACTURING LIGHT EMITTING DEVICE

(75) Inventors: Nam-Choul Yang, Yongin-si (KR); Lian Duan, Yongin-si (KR); Mu-Hyun Kim, Yongin-si (KR); Seong-Taek Lee, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 300 days.

(21) Appl. No.: 12/890,226

(22) Filed: Sep. 24, 2010

(65) Prior Publication Data

US 2011/0014729 A1 Jan. 20, 2011

Related U.S. Application Data

(62) Division of application No. 11/517,481, filed on Sep. 8, 2006, now abandoned.

(30) Foreign Application Priority Data

Sep. 8, 2005 (KR) .................. 10-2005-0083889

(51) Int. Cl.
*H01J 9/00* (2006.01)
(52) U.S. Cl.
USPC ............... 445/23; 437/22; 437/29; 427/66

(58) Field of Classification Search
None
See application file for complete search history.

(56) References Cited

U.S. PATENT DOCUMENTS

| 7,439,673 | B2 | 10/2008 | Dagois et al. | |
|---|---|---|---|---|
| 7,485,337 | B2 | 2/2009 | Nguyen et al. | |
| 7,538,480 | B2 | 5/2009 | Koo et al. | |
| 2006/0061267 | A1 | 3/2006 | Yamasaki et al. | |
| 2006/0084006 | A1* | 4/2006 | Kang et al. | 430/199 |
| 2006/0228974 | A1* | 10/2006 | Thelss et al. | 445/24 |
| 2008/0176349 | A1* | 7/2008 | Suh et al. | 438/34 |

FOREIGN PATENT DOCUMENTS

| KR | 10-0195175 | | 2/1999 |
|---|---|---|---|
| KR | 10-2002-0071782 | | 9/2002 |
| KR | 10-2004-0010814 | * | 2/2004 |
| KR | 10-2005-0065948 | | 6/2005 |
| KR | 10-0570996 | | 4/2006 |

* cited by examiner

*Primary Examiner* — Ashok Patel
(74) *Attorney, Agent, or Firm* — Robert E. Bushnell, Esq.

(57) ABSTRACT

A donor film for a laser induced thermal imaging method capable of improving the optical efficiency of an emission layer, a light emitting device using the same, and a method of manufacturing the light emitting device are provided. The donor film for a laser induced thermal imaging method includes a base substrate, a light to heat conversion layer (LTHC) provided on the base substrate and having a pattern with a predetermined step difference, and a transfer layer provided on the LTHC. It is possible to improve the optical efficiency of the emission layer by patterning the transfer layer using the LTHC having the pattern with a predetermined step difference.

7 Claims, 3 Drawing Sheets

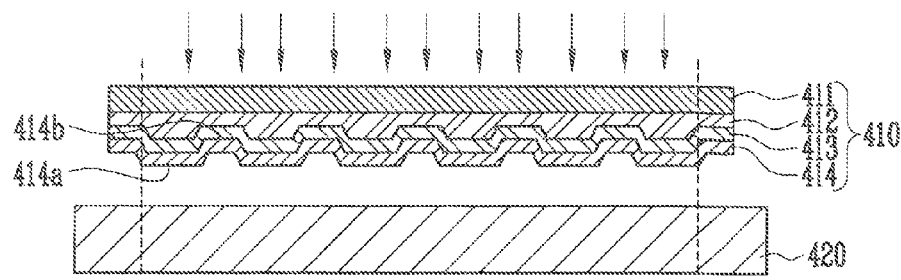
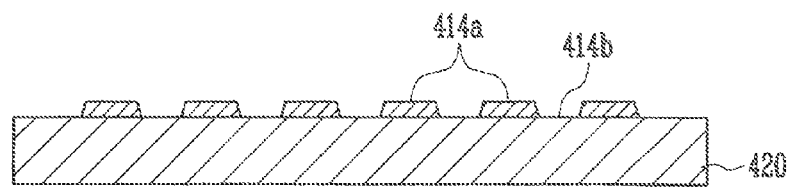
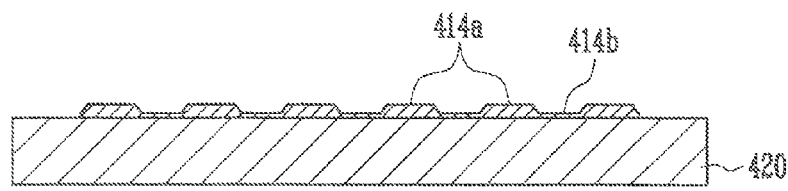

US 8,480,448 B2

DONOR FILM FOR LASER INDUCED THERMAL IMAGING METHOD, LIGHT EMITTING DEVICE USING THE SAME, AND METHOD OF MANUFACTURING LIGHT EMITTING DEVICE

CLAIM OF PRIORITY

This application claims the benefit under 35 USC §121 and 35 USC §120 of prior nonprovisional application U.S. Ser. No. 11/517,481, DONOR FILM FOR LASER INDUCED THERMAL IMAGING METHOD, LIGHT EMITTING DEVICE USING THE SAME, AND METHOD OF MANUFACTURING LIGHT EMITTING DEVICE, filed 8 Sep. 2006, and incorporates by reference the same herein in its entirety, which application makes reference to, and incorporates by reference, and claims all benefits incurring under 35 USC §119 from an application for TRANSCRIPTION ELEMENT FOR LASER INDUCED THERMAL IMAGING METHOD AND LIGHT EMISSION DEVICE AND MANUFACTURING METHOD USING THE SAME earlier filed in the Korean Intellectual Property Office on 8 Sep. 2005 and there duly assigned Serial No. 10-2005-0083889.

BACKGROUND OF THE INVENTION

1. Field of the Invention

The present invention relates to a donor film for a laser induced thermal imaging method, a light emitting device using the same, and a method of manufacturing the light emitting device, and more particularly to, a donor film for a laser induced thermal imaging method capable of improving optical efficiency and optical extraction by forming a pattern having a predetermined step difference on a light to heat conversion layer (LTHC), a light emitting device using the same, and a method of manufacturing the light emitting device.

2. Description of the Related Art

In general, a light emitting device includes a first electrode, a second electrode, and an active layer interposed between the first electrode and the second electrode. An active layer includes an emission layer, a hole injecting layer, a hole transporting layer, an electron transporting layer, and an electron injecting layer. The light emitting device having the above structure is divided into an organic light emitting device and an inorganic light emitting device according to whether the active layer is made of an organic material or an inorganic material. The organic light emitting device is divided into a high molecular organic light emitting device and a low molecular organic light emitting device.

In order to realize the full color of the above-described organic light emitting device, the active layer that constitutes the organic light emitting device must be patterned by each color. In order to pattern the active layer, an inkjet printing method or a laser induced thermal imaging (LITI) method is mainly used. In the above-described patterning methods, the LITI method is a dry process and the inkjet printing method is a wet process. It is possible to more precisely pattern the active layer using the LITI process that is the dry process.

In order to form an organic active layer using the LITI process, a substrate (hereinafter, referred to as an acceptor substrate) on which a first electrode is formed, a donor film provided on the acceptor substrate to transcribe the organic active layer, and a laser that provides light on the donor film.

The manufacturing processes of laminating a transfer layer on an acceptor substrate using a donor film for a laser induced thermal imaging method according to a conventional art is described below.

A donor film includes a base substrate, a light to heat conversion layer (LTHC), a buffer layer, and a transfer layer in the form of a film made of an organic material. The transfer layer includes an emission layer, a hole transporting layer, a hole injecting layer, an electron transporting layer, and an electron injecting layer.

In order to laminate the transfer layer on an acceptor substrate using the LITI process, first, the donor film on which the transfer layer is formed is positioned on the acceptor substrate. To be specific, the donor film is positioned so that the transfer layer contacts the first electrode of the acceptor substrate. Next, when laser is radiated onto the base substrate of the donor film, the LTHC layer converts laser radiation into heat to emit heat so that the transfer layer is transcribed onto the first electrode of the acceptor substrate. Through the above-described processes, the transfer layer made of an organic material is laminated on the acceptor substrate so that it is possible to form the organic active layer of an organic light emitting device. As described above, when the transfer layer in the form of the film made of the organic material is transcribed onto the first electrode of the acceptor substrate, it is possible to easily form the hole injecting organic layer, the hole transporting organic layer, the electron transporting organic layer, and the electron injecting organic layer as well as the organic emission layer.

However, recently, it is necessary to easily form the organic active layer using the LITI process and to obtain the lamination pattern of the organic active layer that provides better emission efficiency than the emission efficiency provided by the active layer having an almost flat surface and that facilitates optical extraction.

SUMMARY OF THE INVENTION

Accordingly, it is an object of the present invention to provide a donor film for a laser induced thermal imaging method capable of improving optical efficiency generated by an emission layer and of facilitating optical extraction, a light emitting device using the same, and a method of manufacturing the light emitting device.

In order to achieve the foregoing and/or other objects of the present invention, according to an aspect of the present invention, there is provided a donor film for a laser induced thermal imaging method including a base substrate, a light to heat conversion layer (LTHC) provided on the base substrate and having a pattern with a predetermined step difference, and a transfer layer provided on the LTHC.

The pattern is preferably a concavo-convex pattern or an embossed pattern. The transfer layer has a transcription pattern corresponding to the pattern formed in the LTHC in the form of a film.

When laser is radiated onto the base substrate, protruding parts of the transcription pattern are first transcribed. The transfer layer is an active layer including at least one layer. The layer includes at least one among an emission layer, a hole injecting layer, a hole transporting layer, an electron transporting layer, and an electron injecting layer. The active layer is formed of an organic material or an inorganic material.

The donor film further includes a buffer layer interposed between the LTHC and the transfer layer.

According to another aspect of the present invention, a method of manufacturing a light emitting device includes providing an acceptor substrate on which a pixel electrode is formed, providing a donor film separated from the acceptor substrate by a predetermined distance and comprising a LTHC having a pattern with a predetermined step difference on a base substrate and a transfer layer provided on the LTHC and having a transcription pattern corresponding to the pattern, arranging the donor film so that the transfer layer faces the pixel electrode of the acceptor substrate, and radiating laser onto a predetermined region of the donor film to transcribe the transfer layer onto the pixel electrode of the acceptor substrate.

Preferably, the method further includes forming a first electrode on the acceptor substrate before forming said transfer layer or forming a first electrode on said transfer layer after forming said transfer layer on the acceptor substrate. In the step of transcribing the transfer layer, when laser is radiated onto the donor film, protruding parts of the transfer layer are first transcribed. The pattern is a concavo-convex pattern or an embossed pattern. On the other hand, the transfer layer is an organic active layer including at least one organic layer. The organic layer includes at least one among an emission organic layer, a hole injecting organic layer, a hole transporting organic layer, an electron transporting organic layer, and an electron injecting organic layer.

According to still another aspect of the present invention, there is provided a light emitting device including at least one first electrode formed on an acceptor substrate, at least one organic layer formed on the first electrode and having a pattern with a predetermined step difference, and a facing electrode formed on the organic layer. The organic layer is in the form of a film and is transcribed onto the first electrode by laser radiation. The organic layer includes at least one among an emission organic layer, a hole injecting organic layer, a hole transporting organic layer, an electron transporting organic layer, and an electron injecting organic layer. The pattern is a concavo-convex pattern or an embossed pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4A and 4B illustrate processes of forming a pattern having a predetermined step difference on the acceptor substrate using a donor film for a laser induced thermal imaging method according to another embodiment of the present invention; and FIG. 4C is a side sectional view illustrating another shape of the transfer layer transcribed as illustrated in FIG. 4A.

DETAILED DESCRIPTION OF PREFERRED EMBODIMENTS

Figure 1A:
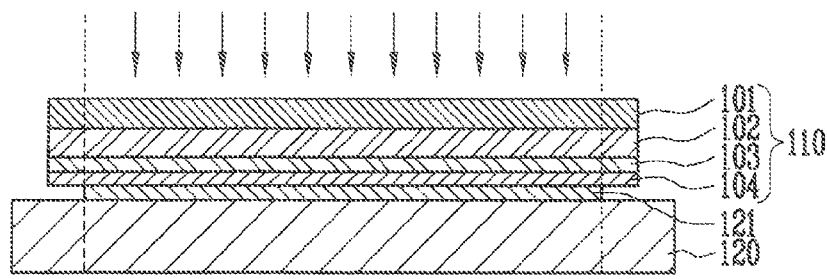
FIGS. 1A and 1B illustrate manufacturing processes of laminating a transfer layer on an acceptor substrate using a donor film for a laser induced thermal imaging method according to a conventional art.
Figure 1B:

Turning now to the drawings, FIGS. 1A and 1B illustrate manufacturing processes of laminating a transfer layer on an acceptor substrate using a donor film for a laser induced thermal imaging method according to a conventional art.

Referring to FIGS. 1A and 1B, a donor film 110 includes a base substrate 101, a light to heat conversion layer (LTHC) 102, a buffer layer 103, and a transfer layer 104 in the form of a film made of an organic material. The transfer layer 104 includes an emission layer, a hole transporting layer, a hole injecting layer, an electron transporting layer, and an electron injecting layer.

In order to laminate the transfer layer 104 on an acceptor substrate 120 using the LITI process, first, the donor film 110 on which the transfer layer 104 is formed is positioned on the acceptor substrate 120. To be specific, the donor film 110 is positioned so that the transfer layer 104 contacts the first electrode 121 of the acceptor substrate 120. Next, when laser is radiated onto the base substrate 101 of the donor film 110, the LTHC layer 102 converts laser radiation into heat to emit heat so that the transfer layer 104 is transcribed onto the first electrode 121 of the acceptor substrate 120. Through the above-described processes, the transfer layer 104 made of an organic material is laminated on the acceptor substrate 120 so that it is possible to form the organic active layer of an organic light emitting device. As described above, when the transfer layer in the form of the film made of the organic material is transcribed onto the first electrode 121 of the acceptor substrate 120, it is possible to easily form the hole injecting organic layer, the hole transporting organic layer, the electron transporting organic layer, and the electron injecting organic layer as well as the organic emission layer.

However, recently, it is necessary to easily form the organic active layer using the LITI process and to obtain the lamination pattern of the organic active layer that provides better emission efficiency than the emission efficiency provided by the active layer having an almost flat surface and that facilitates optical extraction.

Hereinafter, preferable embodiments according to the present invention will be described with reference to the accompanying drawings.

Figure 2:
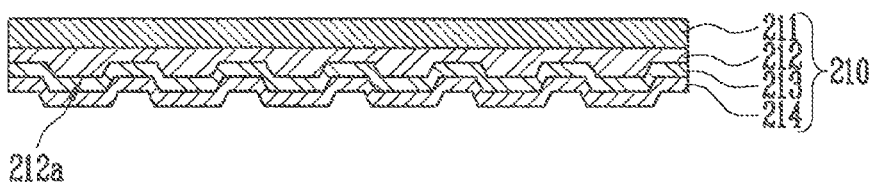
FIG. 2 is a side sectional view illustrating a donor film for a laser induced thermal imaging method according to the present invention.

FIG. 2 is a side sectional view illustrating a donor film for a laser induced thermal imaging method according to the present invention. Referring to FIG. 2, a donor film 210 for a laser induced thermal imaging method according to the present embodiment includes a base substrate 211, a light to heat conversion layer (LTHC) 212 formed on the base substrate 211, a buffer layer 213 formed on the LTHC 212, and a transfer layer 214 formed on the buffer layer 213.

The base substrate 211 operates as a supporting substrate and is made of a transparent high molecular material such as polyethylene terephthalate (PET). The base substrate 211 may be a glass substrate or a film.

The LTHC 212 includes a radiation absorber that absorbs laser radiation to convert the laser radiation into thermal energy. The LTHC 212 includes a radiation absorbing material that absorbs radiation to generate thermal energy and an organic binder material that can be hardened by ultraviolet (UV) rays or heat as the radiation absorber for absorbing laser radiation. The LTHC 212 is obtained by applying an infrared radiation absorber such as carbon black, graphite, and infrared ray pigment to aluminum, an aluminum oxide layer, and sulfide. A pattern 212a having a predetermined step difference is formed at least in a region onto which laser is radiated in the LTHC 212 according to the present invention. The pattern 212a can include a plurality of repeated patterns. The repeated patterns 212a may be concavo-convex or embossed.

The buffer layer 213 formed on the LTHC 212 to protect the LTHC 212 preferably has high thermal resistance and can be formed of an inorganic material or an organic material. The same pattern as the pattern formed in the LTHC 212 is formed in the buffer layer 213.

The transfer layer 214 is formed on the buffer layer 213 in the form of a film. The transfer layer 214 can be formed of an organic material or inorganic material. Repeated patterns corresponding to the LTHC 212 are formed in the transfer layer 214 in the region that contacts the LTHC 212. In general, the pattern formed in the transfer layer 214 is the same as the pattern of the LTHC 212. The organic layer that forms the transfer layer 214 can vary in accordance with the kind of the organic active layer to be formed on an acceptor substrate (not shown). In particular, the emission organic layer, the hole injecting organic layer, the hole transporting organic layer, the electron transporting organic layer, and the electron injecting organic layer may be selectively used as required. The preferred transfer layer is the hole injecting (organic) layer or the electron transporting (organic) layer. The organic active layer can be divided into a high molecular organic layer and a low molecular organic layer in accordance with a material that forms the emission organic layer.

Figure 3A:
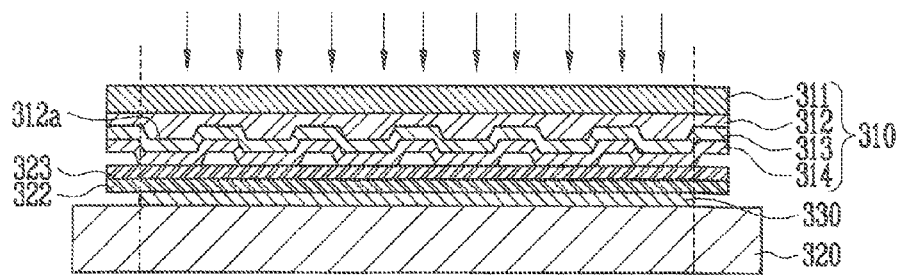
FIGS. 3A and 3B schematically illustrate processes of transcribing a transfer layer onto an acceptor substrate using a donor film for a laser induced thermal imaging method according to an embodiment of the present invention.
Figure 3B:
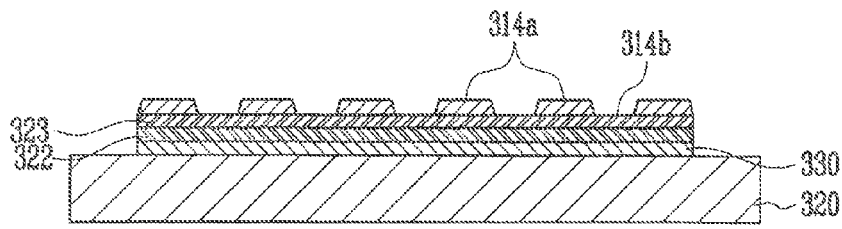

FIGS. 3A and 3B schematically illustrate processes of transcribing a transfer layer onto an acceptor substrate using a donor film for a laser induced thermal imaging method according to an embodiment of the present invention.

In order to laminate a transfer layer 314 on an acceptor substrate 320, first, a donor film 310 including a LTHC 312 in which a pattern having a predetermined step difference is formed on a base substrate 311 and the transfer layer 314 formed on the LTHC 312 is arranged on the acceptor substrate 320 where a first electrode 330 is formed.

According to the present embodiment, a hole injecting organic layer 322, and a hole transporting organic layer 323 are formed on the acceptor substrate 320. In a process of arranging the donor film 310, it is preferable that the uppermost layer of the transfer layer 314 and the uppermost layer of the acceptor substrate 320 contact each other. According to the present embodiment, the transfer layer 314 and the hole transporting organic layer 323 have contact with each other. That is, according to the present embodiment, the transfer layer 314 is used as an emission organic layer.

After the donor film 310 is arranged on the acceptor substrate 320, the transfer layer 314 is transcribed onto the acceptor substrate 320, for example, the hole transporting organic layer 323 using laser (refer to FIG. 3B). Referring to FIG. 3B, the transfer layer 314 is transcribed in an almost correct on and off type in accordance with the pattern of the LTHC 312. That is, in the pattern of the transfer layer 314, protruding parts 314a that contact the acceptor substrate 320 are transcribed and recessed parts 314b are not transcribed.

Figure 3C:
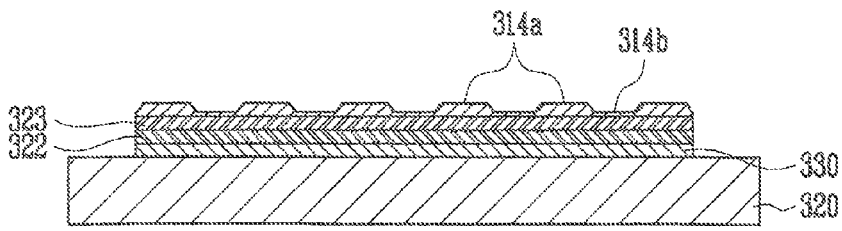
FIG. 3C is a side sectional view illustrating another shape of the transfer layer transcribed as illustrated in FIG. 3A.

On the other hand, FIG. 3C is a side sectional view illustrating another shape of the transfer layer transcribed using the above-described process. Referring to FIG. 2C, in the pattern formed in the transfer layer 314, both of the protruding parts 314a and the recessed parts 314b are transcribed so that the transfer layer of the recessed parts 314b is thinner than the transfer layer of the protruding parts 314a.

According to the above-described structure, since the hole injecting organic layer, the hole transporting organic layer, the emission organic layer, the electron injecting organic layer, and the electron transporting organic layer are transcribed in the form of a film to have repeated patterns, it is possible to increase an organic emission area.

FIGS. 4A and 4B illustrate processes of forming a pattern having a predetermined step difference on an acceptor substrate using a donor film for a laser induced thermal imaging method according to another embodiment of the present invention.

A donor film 410 for a laser induced thermal imaging method according to the present embodiment includes a base substrate 411, a LTHC 412 formed on the base substrate 411, a buffer layer 413 formed on the LTHC 412, and a transfer layer 414 formed on the buffer layer 413. Repeated patterns 412a (for example, concavo-convex and embossed patterns) having a predetermined step difference are formed in the LTHC 412 according to the present embodiment in the region where laser is radiated. In order to avoid redundancy, detailed description of the same components as the components of the donor film illustrated in FIG. 2 will be omitted.

In order to form a pattern on an acceptor substrate 420 using the donor film 410 in which the transfer layer 414 is formed, first, the donor film 410 including the LTHC 412 in which a pattern having a predetermined step difference is formed on the base substrate 411 and the transfer layer 414 formed on the LTHC 412 is arranged on the acceptor substrate 420.

In a process of arranging the donor film 410, it is preferable that the transfer layer 414 and the acceptor substrate 420 contact each other. According to the present embodiment, the transfer layer 414 is formed on the acceptor substrate 420 before the process of forming a first electrode (not shown). After the transfer layer 414 is formed on the acceptor substrate 420, laser is radiated (↓) so that the transfer layer 414 is transcribed onto the acceptor substrate 420. When the laser is radiated onto the surface of the base substrate 411 of the donor film 410, the transfer layer 414 is patterned onto the acceptor substrate 420 in accordance with the pattern of the LTHC 412.

Referring to FIG. 4B, the transfer layer 414 is transcribed onto the acceptor substrate 420 in an almost correct on and off type in accordance with the pattern of the LTHC 412. That is, in the pattern of the transfer layer 414, protruding parts 414a that contact the acceptor substrate 420 are transcribed and recessed parts 414b are not transcribed.

On the other hand, FIG. 4C is a side sectional view illustrating another shape of the transfer layer 414 transcribed using the above-described processes. Referring to FIG. 4C, in the pattern formed in the transfer layer 414, both of the protruding parts 414a and the recessed parts 414b are transcribed so that the transfer layer of the recessed parts 414b is thinner than the transfer layer of the protruding parts 414a. At this time, the transfer layer 414 as illustrated in FIGS. 4B and 4C is made of a generally used high molecular material such as poly methyl metacrylate (PMMA), polypropylene (PP), and polystyrene (PS).

In order to manufacture a light emitting device using the above-described processes, after forming a transcription pattern having a predetermined step difference on the acceptor substrate, a process of forming a first electrode, a process of forming an active layer, and a process of forming a second electrode on an active layer are performed. At this time, the active layer may be formed of only an emission layer. A hole injecting layer and a hole transporting layer can be formed before forming the emission layer and an electron transporting layer and an electron injecting layer may be further formed after forming the emission layer. As described above, in the process of forming the light emitting device, the concavo-convex pattern is formed using the transfer layer 414 before forming the first electrode so that it is possible to increase an emission surface area. The active layer may be formed of an organic material and an inorganic material and may be divided into an organic light emitting device and an inorganic light emitting device according to whether the active layer is formed of an organic material or an inorganic material.

According to the above-described embodiments, the case in which the first electrode is formed and then, the active layer is patterned by the donor film to manufacture the light emitting device and the case in which the transcription pattern having a predetermined step difference is formed on the acceptor substrate and then, the light emitting device including the first electrode is manufactured are disclosed. However, the above-described donor film can be used for a case in which a light emitting device is manufactured using color filters on an acceptor substrate.

According to the embodiments of the present invention, the LTHC includes the radiation absorber that absorbs infrared ray laser radiation. However, the LTHC can include a radiation absorber that absorbs UV rays and visible rays as well as the infrared ray and UV laser and visible ray laser may be used as the laser.

According to the embodiments of the present invention, the donor film in which the LTHC, the buffer layer, and the transfer layer are laminated on the base substrate is disclosed. However, since the buffer layer that constitutes the donor film functions to protect the LTHC, the buffer layer is optional.

Although a few embodiments of the present invention have been shown and described, it would be appreciated by those skilled in the art that changes might be made in this embodiment without departing from the principles and spirit of the invention, the scope of which is defined in the claims and their equivalents.

As described above, since the organic active layer (the emission organic layer, the hole injecting organic layer, the hole transporting organic layer, the electron transporting organic layer, and the electron injecting organic layer) that constitutes the organic light emitting device is patterned using the donor film that includes the LTHC in which the pattern having a predetermined step difference is formed, it is possible to increase the organic emission area. Therefore, it is possible to improve optical extraction efficiency and brightness.

Also, since the pattern having a predetermined step difference is formed on the acceptor substrate using the donor film before forming the pixel electrode, it is possible to improve ability to cope with the unevenness and step difference of the organic active layer formed on the first electrode. Therefore, it is possible to easily apply the present invention to a large substrate. As a result, it is possible to increase an organic emission surface area per a unit area so that it is possible to improve optical extraction and brightness.

What is claimed is:

1. A method of manufacturing a light emitting device, the method comprising the steps of:
    providing an acceptor substrate;
    providing a donor film separated from said acceptor substrate by a predetermined distance and comprising a light to heat conversion layer including a transcription pattern with a predetermined step difference on a base substrate and a transfer layer provided on said light to heat conversion layer including the transcription pattern;
    arranging said donor film so that said transfer layer faces the surface of said acceptor substrate; and
    radiating a laser onto said donor film to transcribe the transfer layer onto said acceptor substrate.

2. The method as claimed in claim 1, before the step of transcribing said transfer layer, further comprising forming a first electrode on the acceptor substrate.

3. The method as claimed in claim 2, further comprising:
    forming an active layer on said first electrode; and
    forming a second electrode on said active layer.

4. The method as claimed in claim 1, after the step of transcribing said transfer layer on the acceptor substrate, further comprising forming a first electrode on said transfer layer.

5. The method as claimed in claim 4, further comprising:
    forming an active layer on said first electrode; and
    forming a second electrode on said active layer.

6. The method as claimed in claim 1, wherein the step of transcribing said transfer layer includes transcribing protruding parts of said transfer layer first.

7. The method as claimed in claim 6, wherein said pattern is a concavo-convex pattern or an embossed pattern.

* * * * *